(12) United States Patent
Steger (10) Patent No.: US 7,161,121 B1
(45) Date of Patent: Jan. 9, 2007

(54) ELECTROSTATIC CHUCK HAVING RADIAL TEMPERATURE CONTROL CAPABILITY

(75) Inventor: Robert J. Steger, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 11/245,764

(22) Filed: Oct. 6, 2005

Related U.S. Application Data

(60) Continuation-in-part of application No. 11/001,218, filed on Nov. 30, 2004, which is a division of application No. 10/062,395, filed on Feb. 1, 2002, now Pat. No. 6,847,014, which is a continuation-in-part of application No. 09/846,432, filed on Apr. 30, 2001, now abandoned.

(51) Int. Cl.
*H05B 1/02* (2006.01)

(52) U.S. Cl. ............... 219/494; 219/486; 118/725; 361/234

(58) Field of Classification Search .......... 219/121.41, 219/121.43, 494, 486, 497; 118/723, 724; 361/234
See application file for complete search history.

(56) References Cited

U.S. PATENT DOCUMENTS

| | | | | |
|---|---|---|---|---|
| 5,294,778 A | * | 3/1994 | Carman et al. | 219/385 |
| 6,080,970 A | * | 6/2000 | Yoshida et al. | 219/444.1 |
| 6,508,884 B1 | * | 1/2003 | Kuibira et al. | 118/725 |
| 6,730,175 B1 | * | 5/2004 | Yudovsky et al. | 118/728 |

* cited by examiner

*Primary Examiner*—Mark Paschall
(74) *Attorney, Agent, or Firm*—Martine Penilla & Gencarella, LLP (57) ABSTRACT

An electrostatic chuck ("chuck") is provided for controlling a radial temperature profile across a substrate when exposed to a plasma. The chuck includes a number of independently controllable gas volumes that are each defined in a radial configuration relative to a top surface of the chuck upon which the substrate is to be supported. The chuck includes a support member and a base plate. The base plate positioned beneath and in a spaced apart relationship from the support member. The gas volumes are defined between the base plate and the support member, with separation provided by annularly-shaped thermally insulating dividers. Each gas volume can include a heat generation source. A gas pressure and heat generation within each gas volume can be controlled to influence thermal conduction through the chuck such that a prescribed radial temperature profile is achieved across the substrate.

21 Claims, 6 Drawing Sheets

ELECTROSTATIC CHUCK HAVING RADIAL TEMPERATURE CONTROL CAPABILITY

CROSS REFERENCE To RELATED APPLICATIONS

This application is a continuation-in-part of prior application Ser. No. 11/001,218, filed on Nov. 30, 2004, which is a divisional of application Ser. No. 10/062,395, filed on Feb. 1, 2002, now U.S. Pat. No. 6,847,014 B1, which is a continuation-in-part of application Ser. No. 09/846,432, filed on Apr. 30, 2001, now abandoned. This application is also related to application Ser. No. 11/001,219, filed on Nov. 30, 2004, and application Ser. No. 11/004,179, filed on Dec. 2, 2004. The disclosure of each above-identified application is incorporated herein by reference.

BACKGROUND

Semiconductor wafer ("wafer") fabrication often includes exposing a wafer to a plasma to allow the reactive constituents of the plasma to modify the surface of the wafer, e.g., remove material from unprotected areas of the wafer surface. The wafer characteristics resulting from the plasma fabrication process are dependent on the process conditions, including the plasma characteristics and wafer temperature. For example, in some plasma processes a critical dimension, i.e., feature width, on the wafer surface can vary by about one nanometer per degree Celsius of wafer temperature. It should be appreciated that differences in wafer temperature between otherwise identical wafer fabrication processes will result in different wafer surface characteristics. Thus, a drift in process results between different wafers can be caused by variations in wafer temperature during plasma processing. Additionally, center-to-edge wafer temperature variations can adversely effect a die yield per wafer.

A general objective in wafer fabrication is to optimize a die yield per wafer and fabricate each wafer of a common type in as identical a manner as possible. To meet these objectives, it is necessary to control fabrication parameters that influence the plasma processing characteristics across an individual wafer and among various wafers of a common type. Because plasma constituent reactivity is proportional to temperature, wafer temperature can have an strong influence on plasma processing results across the wafer and among various wafers. Therefore, a continuing need exists for improvements in wafer temperature control during plasma fabrication processes.

SUMMARY

In one embodiment, an electrostatic chuck is disclosed for controlling a radial temperature profile across a substrate when exposed to a plasma. The electrostatic chuck includes a support member having a bottom surface and a top surface. The top surface of the support member is configured to support the substrate. The electrostatic chuck also includes a base plate positioned beneath the support member and in a spaced apart relationship from the support member. The base plate includes a number of annular grooves that are each defined by an inner wall, an outer wall, and a bottom surface. A number of thermally insulating annular zone partitions are respectively disposed within the number of annular grooves of the base plate. Each of the annular zone partitions has a top surface connected in a sealed manner to the bottom surface of the support member. Also, each of the annular zone partitions has a bottom surface connected in a sealed manner to the bottom surface of the annular groove within which the annular zone partition is disposed. The spaced apart relationship between the base plate and the support member combines with the annular zone partitions to define a number of radially configured independently controllable gas volumes within the electrostatic chuck.

In another embodiment, another electrostatic chuck is disclosed for controlling a radial temperature profile across a substrate when exposed to a plasma. The electrostatic chuck includes a support member having a top surface configured to support the substrate. The support member also includes a planar region and a number of annular fin structures. The planar region is defined between the top surface configured to support the substrate and a bottom surface. Each of the annular fin structures extends perpendicularly from the bottom surface of the planar region of the support member. The electrostatic chuck further includes a base plate positioned beneath the support member and in a spaced apart relationship from the support member. The base plate includes a number of annular grooves. Each of the annular grooves is defined by an inner wall, an outer wall, and a bottom surface. A number of the annular grooves are defined to receive the annular fin structures of the support member. The electrostatic chuck also includes a number of thermally insulating annular zone partitions respectively disposed within a number of the annular grooves of the base plate that are not defined to receive the annular fin structures. Each of the annular zone partitions has a top surface connected in a sealed manner to the bottom surface of the planar region of the support member. Also, each of the annular zone partitions has a bottom surface connected in a sealed manner to the bottom surface of the annular groove within which the annular zone partition is disposed. The spaced apart relationship between the base plate and the support member combines with the annular zone partitions to define a number of radially configured independently controllable gas volumes within the electrostatic chuck.

In another embodiment, a system is disclosed for controlling a radial temperature profile across a substrate when exposed to a plasma. The system includes an electrostatic chuck, a gas supply system, and a computing platform. The electrostatic chuck is defined to include a number of independently controllable gas volumes. The independently controllable gas volumes are defined in a radial configuration relative to a top surface of the electrostatic chuck upon which the substrate is to be supported. The gas supply system is in fluid communication with each of the independently controllable gas volumes. The gas supply system is defined to regulate a gas pressure within each of the independently controllable gas volumes. The gas pressure within a particular independently controllable gas volume influences a thermal conductivity through the particular independently controllable gas volume. The computing platform is defined to monitor a gas pressure within each of the independently controllable gas volumes. In response to the monitored gas pressure within each of the independently controllable gas volumes, the computing platform is defined to control the gas supply system such that a prescribed radial temperature profile is maintained across the substrate to be supported by the electrostatic chuck.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
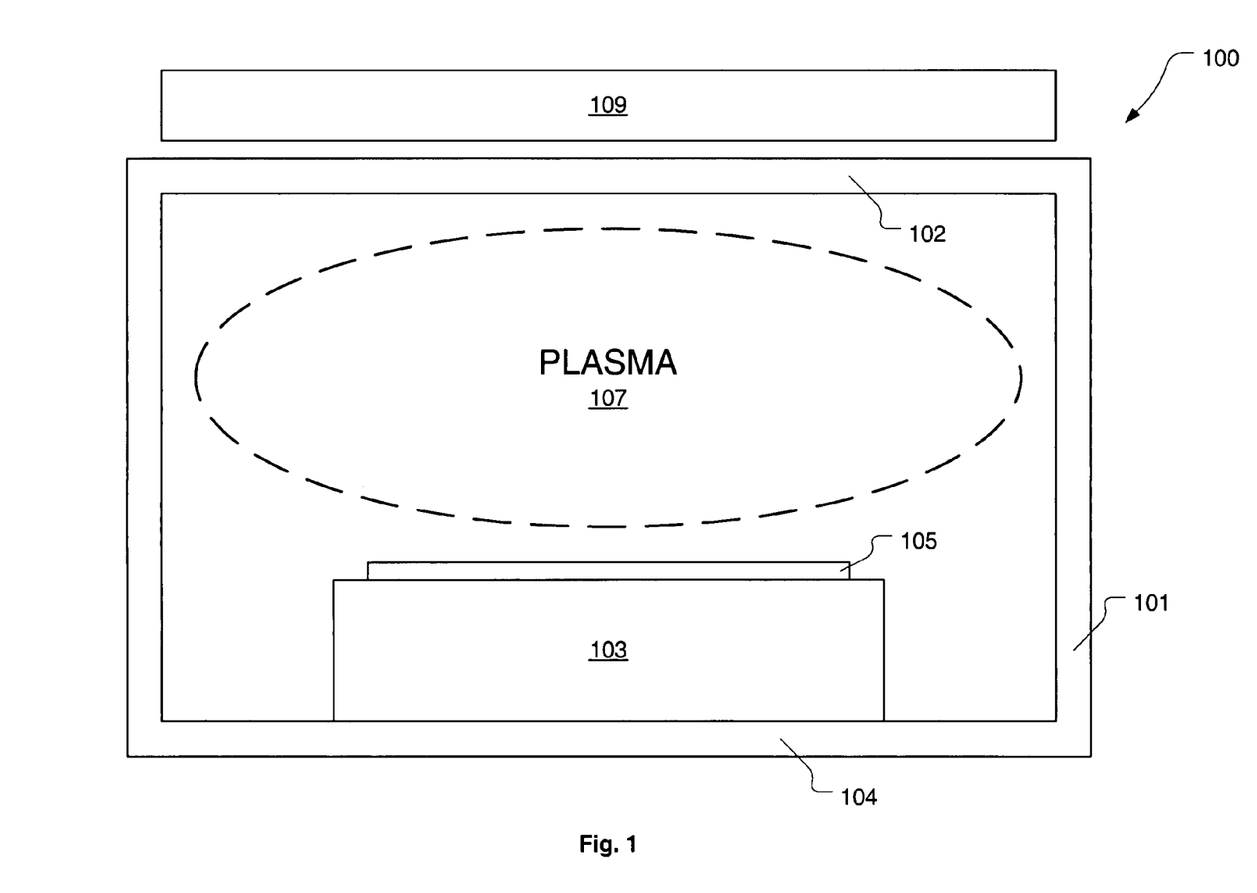
FIG. 1 is an illustration showing a generalized representation of a plasma chamber for semiconductor wafer processing, in accordance with one embodiment of the present invention.

FIG. 1 is an illustration showing a generalized representation of a plasma chamber 100 for semiconductor wafer ("substrate" hereafter) processing, in accordance with one embodiment of the present invention. The chamber 100 is defined by surrounding walls 101, a top 102, and a bottom 104. A chuck 103 is disposed within the chamber 100 to hold a substrate 105 in exposure to a plasma 107 to be generated within the chamber 100. In one embodiment, the chuck 103 is defined as an electrostatic chuck (ESC) capable of being electrically charged to clamp the substrate 105 to the ESC 103. In one embodiment, a coil 109 is defined above the chamber to provide energy for generating the plasma 107 within the chamber internal volume.

During operation, a reactant gas flows through the chamber 100 from a gas lead-in port (not shown) to a gas exhaust port (not shown). High frequency power (i.e., RF power) is then applied from a power supply (not shown) to the coil 109 to cause an RF current to flow through the coil 109. The RF current flowing through the coil 109 generates an electromagnetic field about the coil 109. The electromagnetic field generates an inductive current within the etching chamber 100 internal volume. The inductive current acts on the reactant gas to generate the plasma 107. During the etching process, the coil 109 performs a function analogous to that of a primary coil in a transformer, while the plasma 107 performs a function analogous to that of a secondary coil in the transformer. Although the chamber 100 is described as an inductively coupled plasma chamber, it should be understood that the embodiments of the ESC 103 as presented herein are applicable to any type of plasma processing chamber.

Figure 2A:
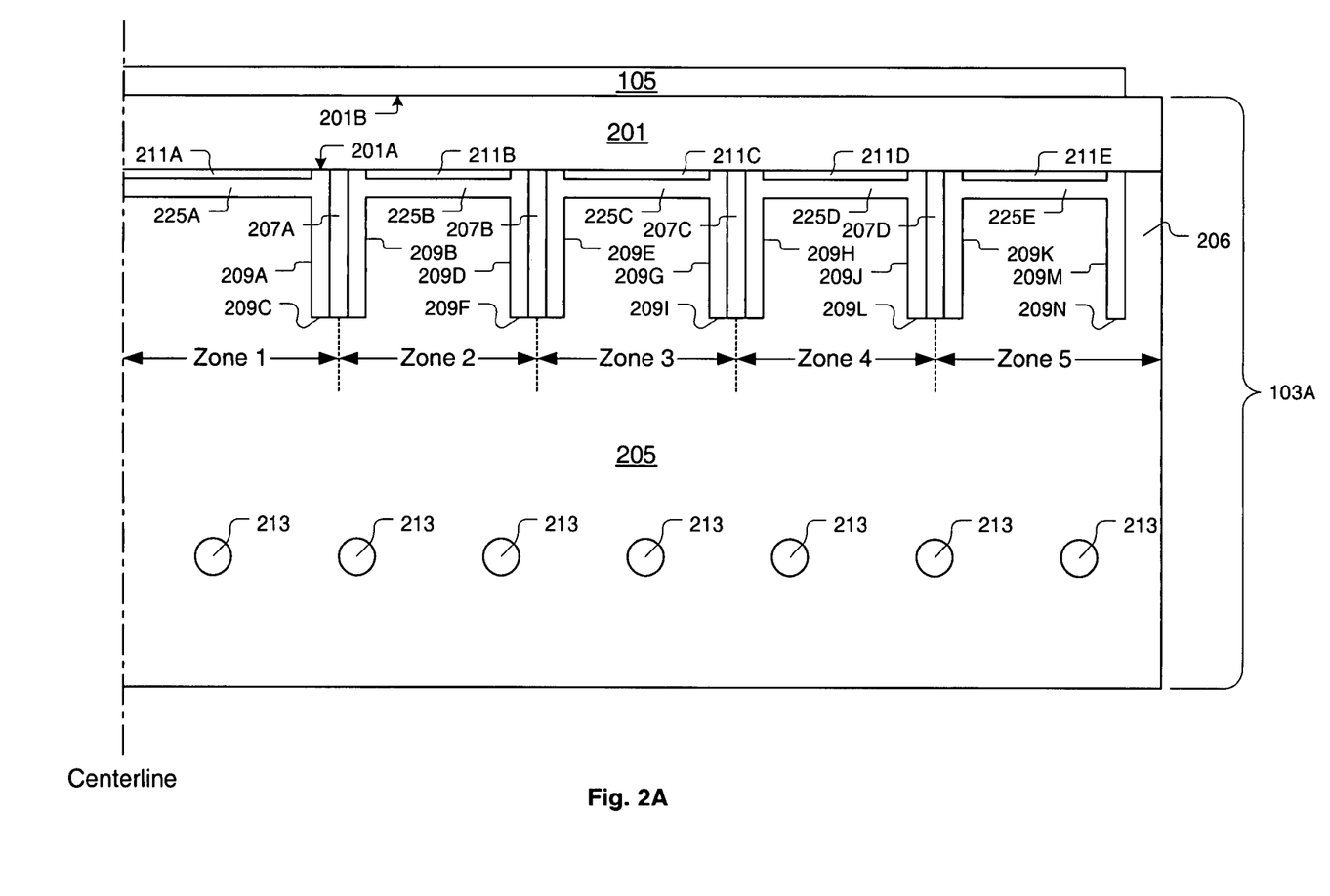
FIG. 2A is an illustration showing a vertical cross-section view of an ESC, in accordance with one embodiment of the present invention.

FIG. 2A is an illustration showing a vertical cross-section view of an ESC 103A, in accordance with one embodiment of the present invention. The ESC 103A is defined to control a radial temperature profile across the substrate 105 when exposed to a plasma. As will be described in further detail below, the ESC 103A includes a number of independently controllable gas volumes that are each defined in a radial configuration relative to a top surface of the ESC 103A upon which the substrate 105 is to be supported. Each of the independently controllable gas volumes includes a respective heat generation source. During exposure of the substrate 105 to the plasma, a gas pressure and heat generation within each independently controllable gas volume is controlled to influence thermal conduction through the ESC 103A such that a prescribed radial temperature profile is achieved across the substrate 105.

The ESC 103A includes a support member 201 having a bottom surface 201A and a top surface 201B. In one embodiment, the support member 201 has a top-to-bottom surface thickness of about 1 millimeter (mm). However, it should be appreciated that in other embodiments the support member 201 can be defined to have essentially any thickness so long as the thickness is suitable for process requirements such as heat transfer. For example, in another embodiment, the support member 201 can have a thickness of about 1 cm. The term "about" as used herein means within plus or minus ten percent of a given value. The top surface 201B of the support member 201 is configured to support the substrate 105 during exposure to the plasma. In various embodiments, the support member 201 can be defined as either a ceramic layer, a base material having a plasma sprayed ceramic coated thereon, a polyimide material, or a polyimide/metal stack. In yet another embodiment, the support member 201 is defined to include an upper layer of a first material and a lower layer of a second material. For example, the upper layer may be defined by a ceramic material, and the lower layer may be defined by a metal such as aluminum. Additionally, the upper and lower layers of the support member 201 can be thermally connected to one another through mechanical means or by using a thermally conductive adhesive. It should be appreciated that the support member 201 can be defined by essentially any material or material combination that is compatible with the substrate 105 and is capable of supporting the substrate 105 during exposure to the plasma while providing appropriate heat transfer performance.

In the embodiment of FIG. 2A, the ESC 103A uses electrical force to attract the substrate 105 to the top surface 201B of the support member 201 and hold the substrate 105 during the plasma process. It should be appreciated, however, that the radial temperature control capability described herein with respect to the ESC 103A can also be implemented within other types of chucks that do not necessarily use electrical force to clamp the substrate 105. For example, the radial temperature control capability as described with respect to the ESC 103A can also be implemented in a chuck that uses mechanical force to hold the substrate 105 during the plasma process.

The ESC 103A also includes a base plate 205 positioned beneath the support member 201 and in a spaced apart relationship from the support member 201 in a region underlying the substrate 105. In one embodiment, the base plate is defined to have a diameter of about 15 inches and a top-to-bottom thickness of about 2 inches. However, it should be appreciated that in other embodiments the base plate 205 can be defined to have a different size. In one embodiment, the base plate 205 is formed from a high thermal conductivity material, e.g., aluminum, and includes a number of cooling channels 213 such that the base plate 205 functions as a heat sink. In one embodiment, a liquid coolant such as water is flowed through the cooling channels 213 to remove heat from the ESC 103A. It should be appreciated, however, that in other embodiments, other types of coolants can be used so long as the particular type of coolant is chemically compatible with the ESC 103A materials.

The base plate 205 includes a number of annular grooves. Each of the annular grooves is defined by an inner wall, an outer wall, and a bottom surface. Also, each of the annular grooves is defined to be substantially centered about a vertical centerline of the ESC 103A. For example, the exemplary ESC 103A of FIG. 2A shows four annular grooves. The inner walls of the annular grooves are defined by surfaces 209A, 209D, 209G, and 209J. The outer walls of the annular grooves are defined by surfaces 209B, 209E, 209H, and 209K. The bottom surfaces of the annular grooves are defined by surfaces 209C, 209F, 209I, and 209L.

A number of thermally insulating annular zone partitions 207A–207D are respectively disposed within the annular grooves of the base plate 205. Each of the annular zone partitions 207A–207D has a top surface connected in a sealed manner to the bottom surface 203A of the support member 201. Also, each of the annular zone partitions 207A–207D has a bottom surface connected in a sealed manner to the bottom surface (209C, 209F, 209I, 209L) of the annular groove within which the annular zone partition 207A–207D is disposed. It should be appreciated that each of the annular zone partitions 207A–207D is positioned within its respective annular groove without contacting either the inner wall (209A, 209D, 209G, 209J) of the annular groove or the outer wall (209B, 209E, 209H, 209K) of the annular groove. Therefore, the thermally insulating annular zone partitions 207A–207D function to limit an amount of solid-to-solid thermal conduction between the support member 201 and the base plate 205. In one embodiment, the annular zone partitions 207A–207D are defined from a plastic material that can be glued to both the support member 201 and the base plate 205.

In one exemplary embodiment, the depth of the annular grooves within the base plate 205 is within a range extending from about 0.5 inch to about 0.75 inch. In this embodiment, it should be appreciated that the annular grooves are relatively deep, such that the thermally insulating annular zone partitions span a relatively large vertical distance from the support member 201 to the base plate 205. Therefore, in this embodiment, it is less likely that an appreciable amount of heat transfer will occur between the support member 201 and the base plate 205 through the low thermal conductivity annular zone partitions 207A–207D.

The base plate 205 also includes a peripheral support structure 206 upon which the support member 201 is disposed in a sealed manner. The support structure 206 not only provides structural support for the support member 201 and the substrate 105, but also enables the RF power to flow from the base plate 205 through the support member 201 to the substrate 105. In the embodiment of FIG. 2A, the support structure 206 is depicted as an extension of the base plate 205. However, in other embodiments, the support structure 206 can be defined by a separate low thermal conductivity material. For example, in one embodiment, the support structure 206 can be defined by an insulating material that is coated with a sufficiently thick RF conductive layer.

The spaced apart relationship between the base plate 205 and the support member 201 combined with the annular zone partitions 207A–207D connected between the base plate 205 and the support member 201 serve to define a number of independently controllable gas volumes 225A–225E within the ESC 103A. More specifically, each of the independently controllable gas volumes 225A–225E is defined between the base plate 205 and the support member 201, with separation provided by the annular zone partitions 207A–207D serving as insulating dividers. The ESC 103A also includes a number of heat generation sources 211A–211E, such as thin film heaters, respectively disposed within the number of independently controllable gas volumes 225A–225E. Each of the heat generation sources 211A–211E is defined to be in contact with the bottom surface 203A of the support member 201 and to avoid contact with the base plate 205. It should be appreciated that each of the independently controllable gas volumes corresponds to a radial temperature control zone (Zone 1–Zone 5) within the ESC 103A.

Figure 2B:
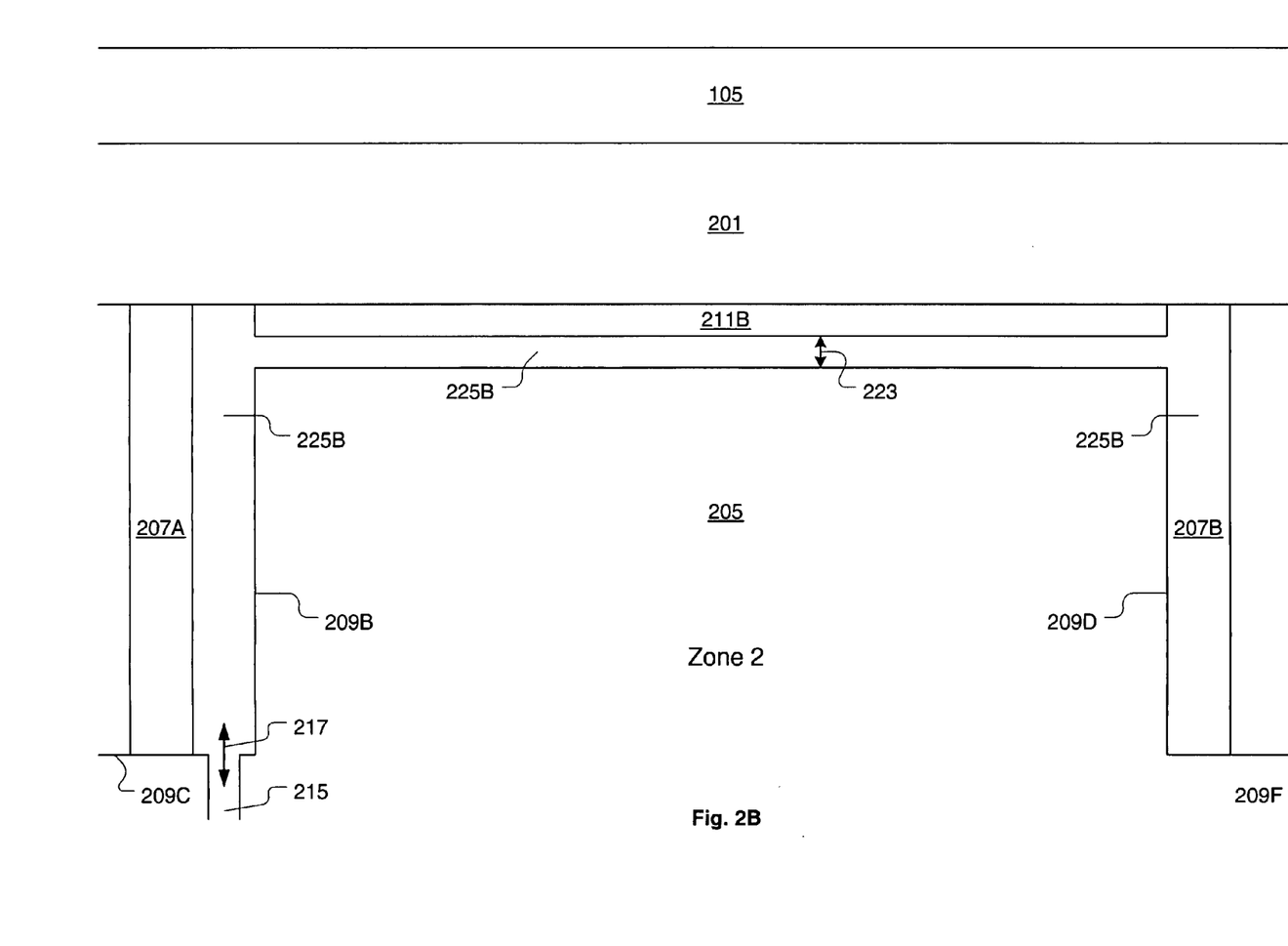
FIG. 2B is an illustration showing a close-up view of Zone 2 as previously described with respect to FIG. 2A.

FIG. 2B is an illustration showing a close-up view of Zone 2 as previously described with respect to FIG. 2A. It should be appreciated that the exemplary description provided for Zone 2 with respect to FIG. 2B is equally applicable to other radial temperature control zones within the ESC 103A as depicted in FIG. 2A. The gas volume 225B of Zone 2 is shown to be bounded by the annular zone partitions 207A and 207B, the support member 201, and the base plate 205. A gas conduit 215 is provided within the base plate 205 to be in fluid communication with the gas volume 225B. During the plasma process, a gas can be supplied or exhausted via the gas conduit 215, as indicated by arrow 217, to achieve a specified gas pressure within the gas volume 225B.

A close-spaced gap 223 exists between the heat generation source 211B and the portion of base plate 205 that is bounded by the annular grooves. More specifically, the gap 223 is defined a horizontal gap between the underside of the heat generation source 211B and the opposing horizontal surface of the base plate 205. In one embodiment, a vertical thickness of the gap is within a range extending from about 0.001 inch to about 0.003 inch. The majority of heat transfer between the metal layer 203 and the base plate 205 occurs through the heat generation source 211B and across the horizontal gap 223. It should be appreciated that by varying the gas pressure within the gas volume 225B, thermal conductivity across the gap 223 can be varied. Thus, the gas pressure within the gas volume 225B can be used to control the heat transfer through the ESC 103A in the vicinity of the radial temperature control zone (Zone 2) corresponding to the gas volume 225B. Therefore, by defining the ESC 103A to include the multiple independently controlled gas volumes 225A–225E, the ESC 103A is defined to have multiple independently controllable radial temperature control zones (Zone 1–Zone 5). Although the embodiment of FIG. 2A depicts five radial temperature control zones, it should be appreciated that a different number of radial temperature control zones can be implemented in other embodiments. Implementation of more radial temperature control zones provides more capability with respect to controlling a radial temperature gradient across the substrate 105.

By controlling the gas pressure, and hence thermal conductivity, within the various radial temperature control zones (Zone 1–Zone 5), a prescribed radial temperature gradient can be established from the center of the substrate 105 to the edge of the substrate 105. In one embodiment, the gas pressure within a particular gas volume 225A–225E can be controlled within a range extending from about 10 torr to about 1 atm. In one embodiment, helium gas is supplied to the various gas volumes 225A–225E. However, in other embodiments, other types of gas or gas mixtures, e.g., nitrogen, can be supplied the various gas volumes 225A–225E. In yet another embodiment, a liquid rather than a gas can be supplied to the various gas volumes 225A–225E. Additionally, although the present invention is described as having radially-shaped temperature control zones, it should be appreciated that in other embodiments the various independently controllable gas volumes within the ESC 103A can be defined to correspond to non-radial geometric configurations. For example, in other embodiments, the various gas volumes within the ESC 103A can be defined in a hexagonally divided configuration or in a quadrant divided configuration.

The heat transfer through a particular radial temperature control zone (Zone 1–Zone 5) of the ESC 103A is not only influenced by the pressure-dependent thermal conductivity of the gas within the particular zone, but is also influenced by the thermal output of the heat generation source 211A–211E disposed within the particular zone. More specifically, each heat generation source 211A–211E can be controlled independently to enhance the plasma heat flux to enable creation of stronger temperature gradient through the ESC 103A from the substrate 105 to the base plate 205. It should be appreciated that the thermal output of each heat generation sources 211A–211E can be increased or decreased in a common manner to adjust a dynamic temperature range of a process window without changing the radial temperature profile as defined by the various gas pressures within the various radial temperature control zones. Additionally, the heat generation sources 211A–211E can be under computer control based on temperature monitoring feedback or a prescribed process recipe to ensure that the appropriate temperature within each zone is maintained. For example, in one embodiment, closed-loop feedback control is used to control the heat generation sources in two zones, while the heat generation sources in the other three zones are statically set based on calculation. Rather than requiring temperature monitors in all five radial zones, this particular example embodiment only requires temperature monitors in the two zones that have closed-loop feedback control. Thus, this example embodiment saves the cost and space associated with temperature monitors in the three zones that do not have closed-loop feedback control. In addition to the above-described example embodiment, it should be appreciated that many different schemes regarding heat generation source control can be implemented to satisfy varying process and system requirements.

In one embodiment, the heat generation source 211A–211E present in each radial temperature control zone (Zone 1–Zone 5) can be part of a common heat generation source. In another embodiment, the heat generation source 211A–211E present in each radial temperature control zone (Zone 1–Zone 5) can be independent. In one variation of this embodiment, each of the heat generation sources 211A–211E is defined to provide a common thermal output and be commonly controlled. In another variation of this embodiment, each of the heat generation sources 211A–211E is defined to be independently controlled. Additionally, in the embodiment of FIGS. 2A–2B, the heat generation sources 211A–211E are disposed within the gas volumes 225A–225E and in contact with the bottom surface 203A of the support member 201. However, in another embodiment, each heat generation source 211A–211E can be embedded within the support member 201 at a location overlying its respective radial temperature control zone (Zone 1–Zone 5). It should be appreciated that the flexibility in heat generation source configuration provides an extensive capability to compensate for non-uniform plasmas, particularly plasmas that are non-uniform in the radial direction.

Figure 3A:
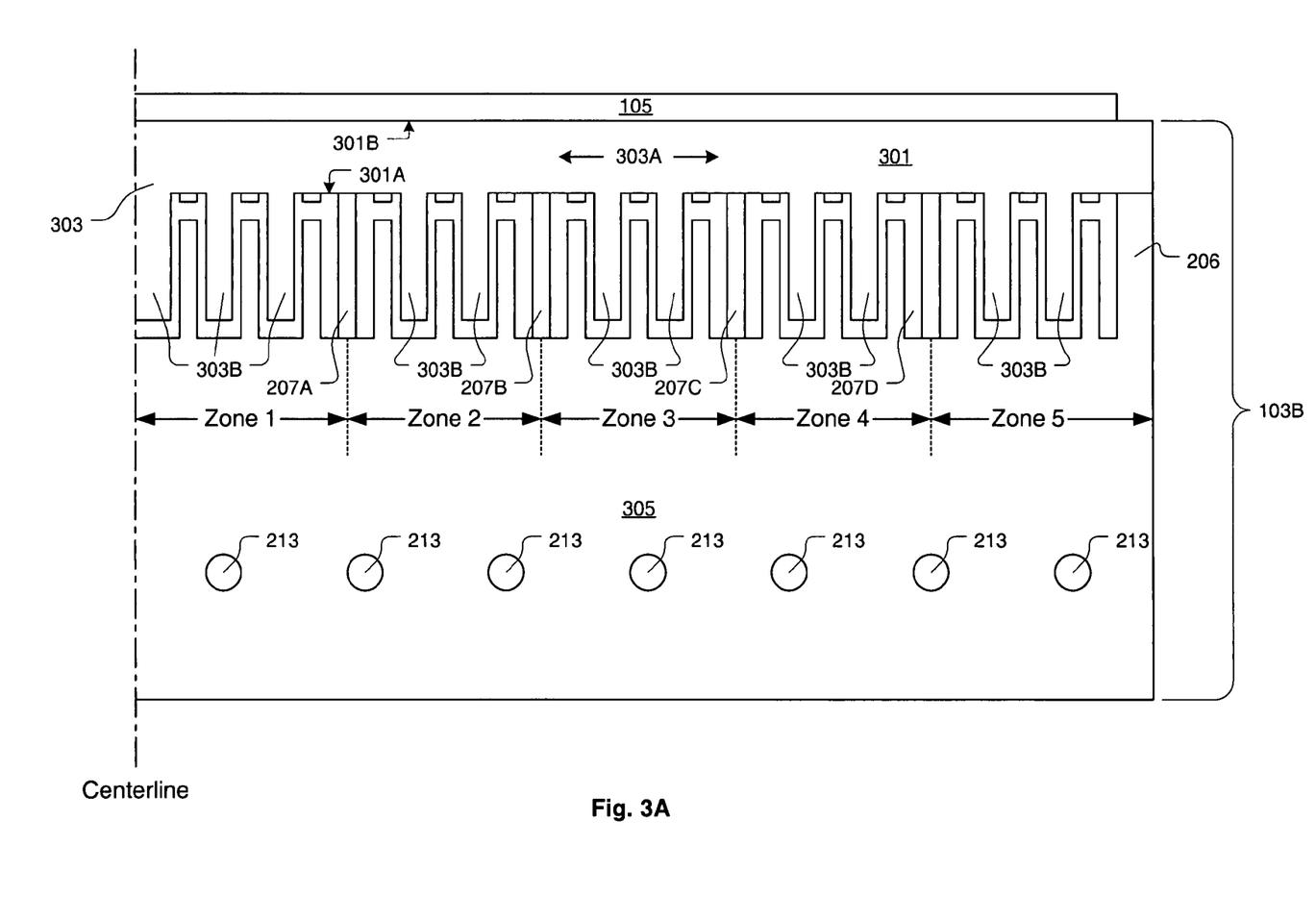
FIG. 3A is an illustration showing a vertical cross-section view of an ESC for controlling a radial temperature profile across the substrate when exposed to a plasma, in accordance with another embodiment of the present invention.

FIG. 3A is an illustration showing a vertical cross-section view of an ESC 103B for controlling a radial temperature profile across the substrate 105 when exposed to a plasma, in accordance with another embodiment of the present invention. The ESC 103B includes a support member 301 having a top surface 301B configured to support the substrate 105. It should be appreciated that in terms of material composition and flexibility of configuration, the support member 301 of FIG. 3A is equivalent to the support member 201 previously described with respect to FIGS. 2A–2B.

The support member 301 includes a planar region 303A and a number of annular fin structures 303B. The planar region 303A of the support member 301 is defined between the top surface 301B and a bottom surface 301A. Each of the number of annular fin structures 303B extends perpendicularly from the bottom surface 301A of the planar region 303A. In one embodiment, a top-to-bottom surface thickness of the planar region 303A is about 1 mm. However, it should be appreciated that in other embodiments the top-to-bottom surface thickness of the planar region 303A can be defined to have essentially any thickness so long as the thickness is suitable for process requirements such as heat transfer.

The ESC 103B also includes a base plate 305 positioned beneath the support member 301 and in a spaced apart relationship from the support member 301 in a region underlying the substrate 105. As with the base plate 205, the base plate 305 is formed from a high thermal conductivity material and includes a number of cooling channels 213 such that the base plate 305 functions as a heat sink. In a manner similar to the base plate 205 previously described with respect to FIGS. 2A–2B, the base plate 305 includes a number of annular grooves. Each interior annular groove is defined by an inner wall, an outer wall, and a bottom surface. The exterior annular groove is defined by an inner wall and a bottom surface. A number of the annular grooves are defined to receive the annular fin structures 303B of the metal member 303. Also, a number of annular grooves are defined to receive thermally insulating zone partitions.

Figure 3B:
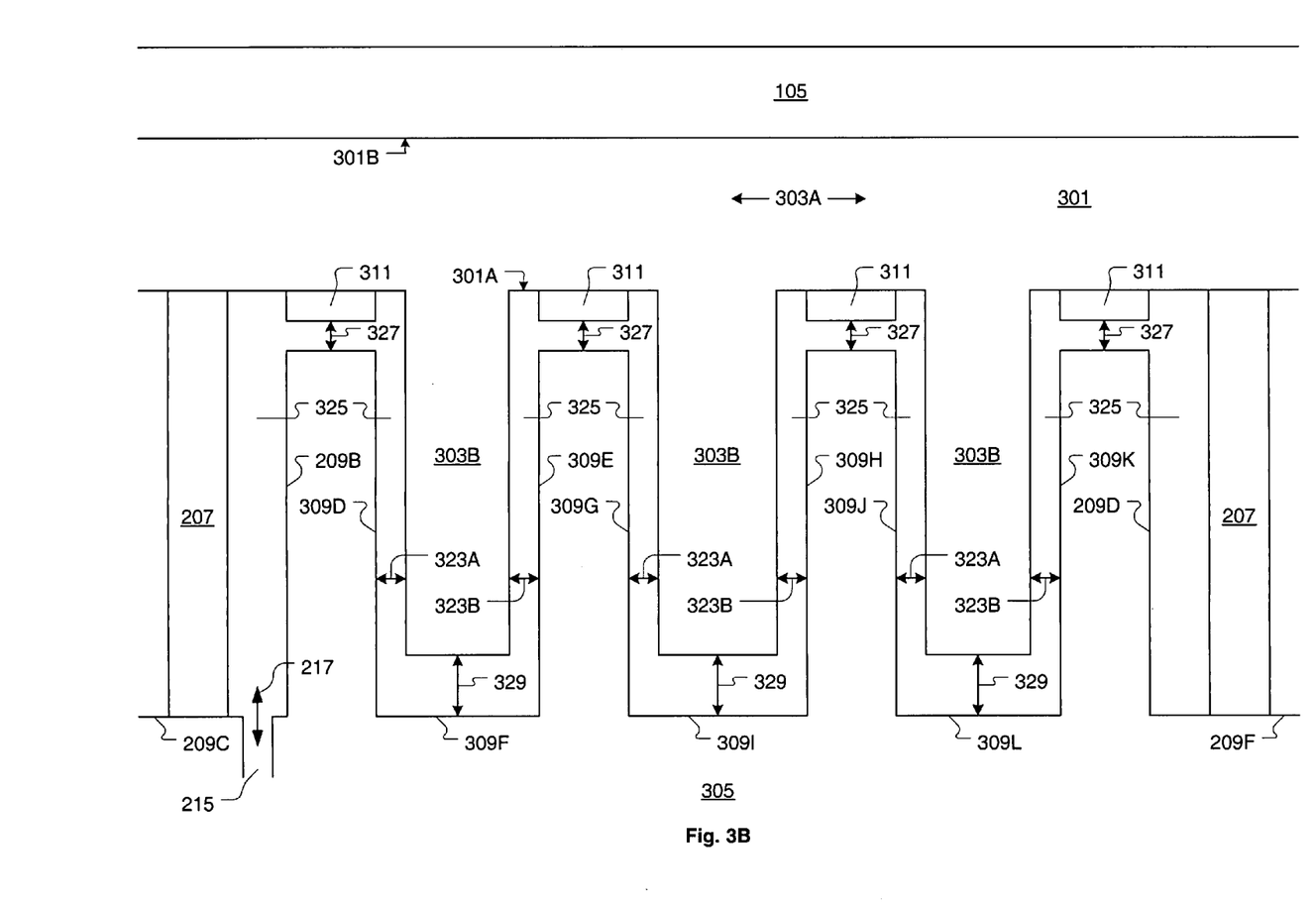
FIG. 3B is an illustration showing a close-up view of the interface between the metal member and the base plate within a radial temperature control zone, in accordance with one embodiment of the present invention.

FIG. 3B is an illustration showing a close-up view of the interface between the support member 301 and the base plate 305 within a radial temperature control zone (Zone 1–Zone 5), in accordance with one embodiment of the present invention. The annular grooves for receiving the annular fin structures 303B are defined by a respective inner wall (309D, 309G, 309J), a respective outer wall (309E, 309H, 309K), and a respective bottom surface (309F, 309I, 309L). In a similar manner, each of the annular fin structures 303B is defined by a respective inner surface, a respective outer surface, and a respective bottom surface. The spaced apart relationship between the base plate 305 and the support member 301 forms a first gap 323A between the inner wall of the annular groove and the inner surface of the annular fin structure received by the annular groove. The spaced apart relationship between the base plate 305 and the support member 301 also forms a second gap 323B between the outer wall of the annular groove and the outer surface of the annular fin structure received by the annular groove. In one embodiment, each of the first and second gaps 323A and 323B have a thickness within a range extending from about 0.001 inch to about 0.003 inch.

In one embodiment, the support member 301 and the base plate 305 can be accurately machined. In this embodiment, use of index points can enable accurate positioning of the annular fin structures 303B within their respective annular grooves in the base plate 305. Additionally, it should be appreciated that a compensating variation in gap thickness 323A and 323B on opposing sides of a particular annular fin structure 303B will cause the net thermal conductivity from the particular annular fin structure 303B to the base plate 305 to be substantially unaffected by variations in the thickness of the gaps 323A and 323B.

The spaced apart relationship between the base plate 305 and the support member 301 forms a third gap 327 between the base plate 305 and the bottom surface 301A of the planar region 303A of the support member 301. The spaced apart relationship between the base plate 305 and the support member 301 also forms a fourth gap 329 between the bottom surface of the annular fin structures 303B and the base plate 305. Because heat transfer occurs primarily between the inner and outer surfaces of the annular fin structures 303B and the inner and outer walls of the annular grooves, respectively, the thickness of gaps 327 and 329 are not critical. Therefore, the thickness of gaps 327 and 329 can be made relatively large to ensure that the support member 301 does not contact the base plate 305 during assembly of the ESC 103B.

The ESC 103B also includes a number of thermally insulating annular zone partitions 207A–207D respectively disposed within a number of the annular grooves in the base plate 305 that are not defined to receive the annular fin structures 303B. Each of the annular zone partitions 207A–207D has a top surface connected in a sealed manner to the bottom surface 301A of the planar region 303A of the support member 301. Also, each of the annular zone partitions 207A–207D has a bottom surface connected in a sealed manner to the bottom surface of the annular groove within which the annular zone partition 207A–207D is disposed. Additionally, each of the annular zone partitions 207A–207D is positioned within its respective annular groove without contacting either the inner wall or the outer wall of the annular groove.

The spaced apart relationship between the base plate 305 and the support member 301 combines with the annular zone partitions 207A–207D connected between the base plate 305 and the support member 301 to define a number of independently controllable gas volumes within the ESC 103B. For example, FIG. 3B shows an independently controllable gas volume 325 defined between the base plate 305 and the support member 301, with separation provided by the annular zone partitions 207 serving as insulating dividers. It should be appreciated that each of the independently controllable gas volumes corresponds to a radial temperature control zone (Zone 1–Zone 5) within the ESC 103B. By controlling the gas pressure, and hence thermal conductivity, within the various radial temperature control zones (Zone 1–Zone 5), a prescribed radial temperature gradient can be established from the center of the substrate 105 to the edge of the substrate 105. As with the ESC 103A of FIGS. 2A–2B, various embodiments of the ESC 103B can implement a different number of radial temperature control zones or a different geometric configuration of temperature control zones. Also, as with the ESC 103A, various embodiments of the ESC 103B can supply helium gas, nitrogen gas, or other types of gas/gas mixtures to the gas volumes within each radial temperature control zone.

The ESC 103B also includes a number of heat generation sources 311, such as thin film heaters, respectively disposed within the number of independently controllable gas volumes. In one embodiment, each of the heat generation sources 311 is in contact with the bottom surface 301A of the planar region 303A of the support member 301 between adjacent annular fin structures 303B. Each of the heat generation sources 311 is defined to avoid contact with the base plate 305. In one embodiment, the heat generation source 311 present in each radial temperature control zone (Zone 1–Zone 5) can be part of a common heat generation source. In another embodiment, the heat generation source 311 present in each radial temperature control zone (Zone 1–Zone 5) can be independent. In one variation of this embodiment, each of the heat generation sources 311 is defined to provide a common thermal output and be commonly controlled. In another variation of this embodiment, each of the heat generation sources 311 is defined to be independently controlled. Additionally, in another embodiment, each heat generation source 311 can be embedded within the support member 301 at a location overlying its respective radial temperature control zone (Zone 1–Zone 5).

As with the ESC 103A of FIGS. 2A–2B, the heat transfer through a particular radial temperature control zone (Zone 1–Zone 5) of the ESC 103B is not only influenced by the pressure-dependent thermal conductivity of the gas within the particular zone, but is also influenced by the thermal output of the heat generation source 311 disposed within the particular zone. By controlling the gas pressure, and hence thermal conductivity, within the various radial temperature control zones (Zone 1–Zone 5) of the ESC 103B, a prescribed radial temperature gradient can be established from the center of the substrate 105 to the edge of the substrate 105. In one embodiment, the gas pressure within a particular gas volume of the ESC 103B can be controlled within a range extending from about 10 torr to about 1 atm. Also, the thermal output of each heat generation source 311 can be increased or decreased in a common manner to adjust a dynamic temperature range of a process window without changing the radial temperature profile as defined by the various gas pressures within the various radial temperature control zones.

For a number of reasons, such as plasma reactant depletion, there tend to be fewer plasma reactants near the edge of the substrate during the plasma process. As a consequence, lateral etch rates change between the center of the substrate and the edge of the substrate. The lateral etch rates have a direct effect on the resulting critical dimension across the wafer. The multiple radial temperature control zone capability provided by the ESCs of the present invention enables compensation for lateral etch rate variation across the wafer by controlling the radial temperature profile across the wafer. For example, the ESCs of the present invention can create a wafer radial temperature profile as a process tuning vehicle primarily targeting critical, i.e., lateral, dimension control. Thus, the multiple radial temperature zone profiling capability provided by the ESCs of the present invention enable a better fit to critical dimension bias compensation data, particularly at the edge of the substrate.

Because the gas pressure within a particular radial temperature zone of the ESC can be adjusted quickly, the thermal conductivity through the particular radial temperature zone can also be adjusted quickly. As a result, the ESC enables real-time control of the radial temperature profile across the substrate. For example, by varying the gas pressures in the different radial zones, the substrate temperature can be changed by up to 4° C./sec. This rapid rate of temperature change can reduce temperature settling time between process steps in cases where the temperature profile must change between steps, which can lead to improved substrate throughput. The ESCs of the present invention also enable a center-to-edge substrate temperature gradient to exceed 30° C. Additionally, the heat generation sources present within the ESCs enable a global temperature profile to be varied by more than 40° C.

Figure 4:
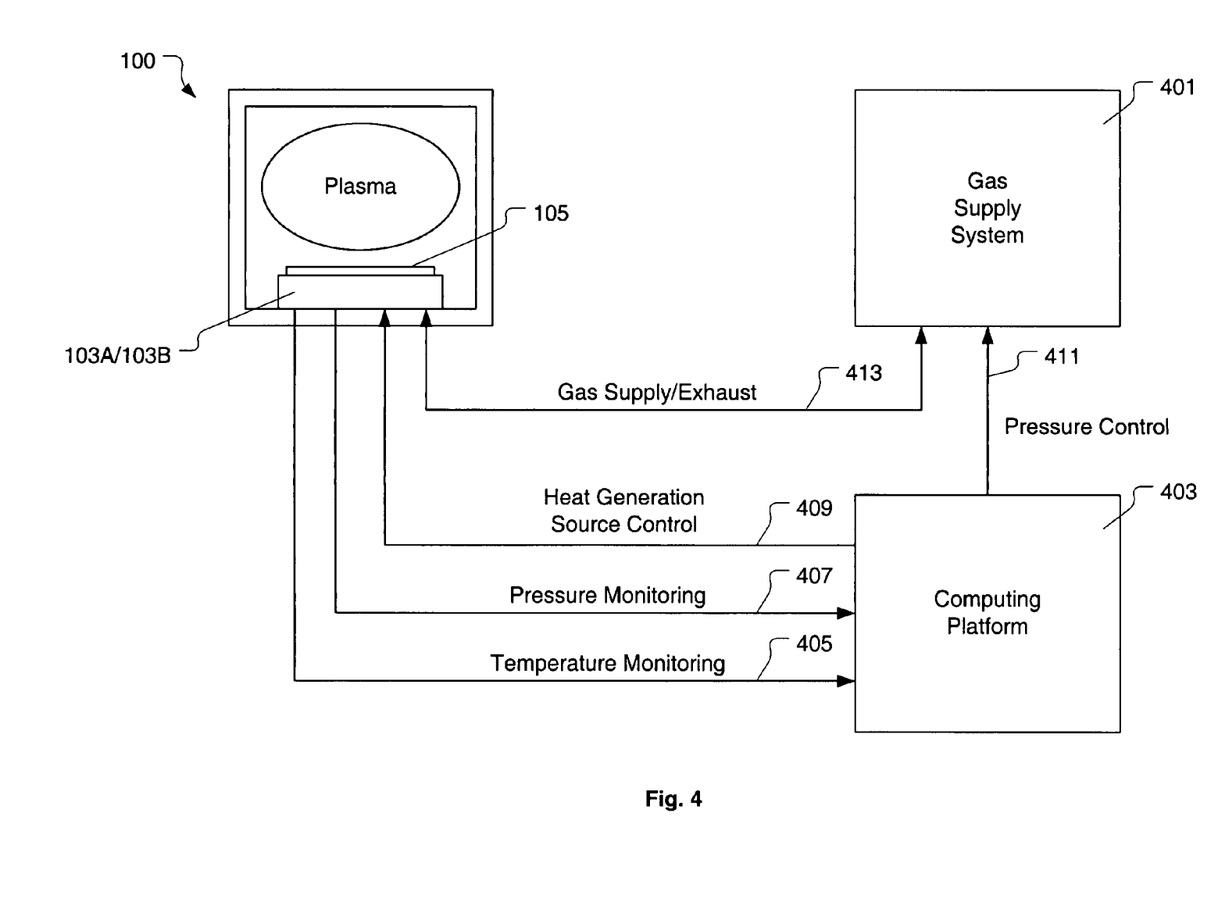
FIG. 4 is an illustration showing a system for controlling a radial temperature profile across a substrate when exposed to a plasma, in accordance with one embodiment of the present invention.

FIG. 4 is an illustration showing a system for controlling a radial temperature profile across a substrate when exposed to a plasma, in accordance with one embodiment of the present invention. The system includes the plasma processing chamber 100 having either the ESC 103A or the ESC 103B present therein. For ease of discussion, the term "ESC" as used in the remainder of this description will refer equally to either the ESC 103A or the ESC 103B. The ESC is defined to include a number of independently controllable gas volumes. In one embodiment, these gas volumes are defined in a radial configuration relative to a top surface of the ESC upon which the substrate 105 is to be supported.

The system also includes a gas supply system 401 in fluid communication with each of the plurality of independently controllable gas volumes, as indicated by arrow 413. The gas supply system 401 is defined to regulate a gas pressure within each of the independently controllable gas volumes within the ESC. As previously discussed, the gas pressure within a particular independently controllable gas volume of the ESC influences a thermal conductivity through the particular independently controllable gas volume. Also, as previously discussed, the ESC includes a number of heat generation sources respectively disposed within each of the independently controllable gas volumes. Additionally, one or more of the independently controllable gas volumes of the ESC can include a temperature sensor and/or a pressure sensor.

The system further includes a computing platform 403 defined to monitor a temperature and a gas pressure within one or more of the independently controllable gas volumes of the ESC, as indicated by arrows 405 and 407, respectively. In response to the monitored temperature and gas pressure within the independently controllable gas volumes of the ESC, the computing platform is defined to compute heat generation source and gas pressure adjustments for the independently controllable gas volumes as necessary to maintain a prescribed radial temperature profile across the substrate 105. Then the computing platform 403 sends appropriate heat generation source control signals to the ESC, as indicated by arrow 409. Also, the computing platform 403 sends appropriate gas pressure control signals to the gas supply system 401, as indicated by arrow 411. In response, the gas supply system 401 ensures that the gas pressure in the independently controllable gas volumes of the ESC is properly adjusted.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. An electrostatic chuck for controlling a radial temperature profile across a substrate when exposed to a plasma, comprising:
    a support member having a bottom surface and a top surface, the top surface of the support member configured to support the substrate;
    a base plate positioned beneath the support member and in a spaced apart relationship from the support member, the base plate including a plurality of annular grooves, each of the plurality of annular grooves defined by an inner wall, an outer wall, and a bottom surface; and
    a plurality of thermally insulating annular zone partitions respectively disposed within the plurality of annular grooves of the base plate, each of the plurality of annular zone partitions having a top surface connected in a sealed manner to the bottom surface of the support member, each of the plurality of annular zone partitions having a bottom surface connected in a sealed manner to the bottom surface of the annular groove within which the annular zone partition is disposed,
    wherein a plurality of independently controllable gas volumes is defined by the spaced apart relationship between the base plate and the support member and the plurality of annular zone partitions connected between the base plate and the support member.

2. An electrostatic chuck as recited in claim 1, wherein each of the plurality of annular zone partitions is positioned within its respective annular groove without contacting either the inner wall of the annular groove or the outer wall of the annular groove.

3. An electrostatic chuck as recited in claim 1, wherein the base plate is formed from a high thermal conductivity material and includes a number of cooling channels such that the base plate functions as a heat sink.

4. An electrostatic chuck as recited in claim 1, further comprising:
    a plurality of thin film heaters respectively disposed within the plurality of independently controllable gas volumes and in contact with the bottom surface of the support member.

5. An electrostatic chuck as recited in claim 4, wherein a gap exists between each of the plurality of thin film heaters and a portion of the base plate bounded by one or more of the annular grooves, a vertical thickness of the gap being within a range extending from about 0.001 inch to about 0.003 inch.

6. An electrostatic chuck as recited in claim 4, wherein each of the plurality of thin film heaters is defined to be independently controlled based on either closed-loop feedback or a prescribed process recipe.

7. An electrostatic chuck as recited in claim 1, further comprising:
    a plurality of gas conduits defined within the base plate to be in fluid communication with respective ones of the plurality of independently controllable gas volumes.

8. An electrostatic chuck for controlling a radial temperature profile across a substrate when exposed to a plasma, comprising:
    a support member having a top surface configured to support the substrate, the support member having a planar region and a plurality of annular fin structures, the planar region defined between the top surface configured to support the substrate and a bottom surface, each of the plurality of annular fin structures extending perpendicularly from the bottom surface of the planar region;
    a base plate positioned beneath the support member and in a spaced apart relationship from the support member, the base plate including a plurality of annular grooves, each of the plurality of annular grooves defined by an inner wall, an outer wall, and a bottom surface, wherein a number of the plurality of annular grooves are defined to receive the plurality of annular fin structures of the support member; and
    a plurality of thermally insulating annular zone partitions respectively disposed within a number of the plurality of annular grooves of the base plate that are not defined to receive the plurality of annular fin structures, each of the plurality of annular zone partitions having a top surface connected in a sealed manner to the bottom surface of the planar region of the support member, each of the plurality of annular zone partitions having a bottom surface connected in a sealed manner to the bottom surface of the annular groove within which the annular zone partition is disposed, wherein a plurality of independently controllable gas volumes is defined by the spaced apart relationship between the base plate and the support member and the plurality of annular zone partitions connected between the base plate and the support member.

9. An electrostatic chuck as recited in claim 8, wherein each of the plurality of annular zone partitions is positioned within its respective annular groove without contacting either the inner wall or the outer wall of the annular groove, and wherein each of the plurality of annular fin structures is received within its respective annular groove without contacting either the inner wall, the outer wall, or the bottom surface of the annular groove.

10. An electrostatic chuck as recited in claim 8, wherein the base plate is formed from a high thermal conductivity material and includes a number of cooling channels such that the base plate functions as a heat sink.

11. An electrostatic chuck as recited in claim 8, further comprising:
a plurality of thin film heaters respectively disposed within the plurality of independently controllable gas volumes and in contact with the bottom surface of the planar region of the support member between adjacent annular fin structures, each of the plurality of thin film heaters defined to avoid contact with the base plate.

12. An electrostatic chuck as recited in claim 11, wherein each of the plurality of thin film heaters is defined to be independently controlled based on either closed-loop feedback or a prescribed process recipe.

13. An electrostatic chuck as recited in claim 8, wherein each of the plurality of annular fin structures is defined by an inner surface, an outer surface, and a bottom surface, the spaced apart relationship between the base plate and the support member forming a first gap between the inner wall of the annular groove and the inner surface of the annular fin structure received by the annular groove, the spaced apart relationship between the base plate and the support member forming a second gap between the outer wall of the annular groove and the outer surface of the annular fin structure received by the annular groove, each of the first and second gaps having a thickness within a range extending from about 0.001 inch to about 0.003 inch.

14. An electrostatic chuck as recited in claim 8, further comprising:
a plurality of gas conduits defined within the base plate to be in fluid communication with respective ones of the plurality of independently controllable gas volumes.

15. A system for controlling a radial temperature profile across a substrate when exposed to a plasma, comprising:
an electrostatic chuck defined to include a plurality of independently controllable gas volumes, the plurality of independently controllable gas volumes being defined in a radial configuration relative to a top surface of the electrostatic chuck upon which the substrate is to be supported;

a gas supply system in fluid communication with each of the plurality of independently controllable gas volumes, the gas supply system defined to regulate a gas pressure within each of the plurality of independently controllable gas volumes, the gas pressure within a particular independently controllable gas volume influencing a thermal conductivity through the particular independently controllable gas volume; and a computing platform defined to monitor a gas pressure within each of the plurality of independently controllable gas volumes, the computing platform further defined to control the gas supply system in response to the monitored gas pressure within each of the plurality of independently controllable gas volumes such that a prescribed radial temperature profile is maintained across the substrate to be supported by the electrostatic chuck.

16. A system as recited in claim 15, further comprising:
a plurality of heat generation sources respectively disposed within each of the plurality of independently controllable gas volumes, wherein each of the plurality of heat generation sources is defined to be independently controlled based on either closed-loop feedback or a prescribed process recipe.

17. A system as recited in claim 15, wherein the electrostatic chuck includes a support member having a top surface defined to support the substrate, the electrostatic chuck further including a base plate positioned beneath and in a spaced apart relationship from the support member, the plurality of independently controllable gas volumes defined between the base plate and the support member.

18. A system as recited in claim 17, wherein adjacent ones of the plurality of independently controllable gas volumes are separated from one another by an annularly-shaped thermally insulating divider connected in a sealed manner with both the support member and the base plate.

19. A system as recited in claim 18, wherein each of the annularly-shaped thermally insulating dividers is defined to extend vertically through a respective annular groove defined within the base plate, the respective annular groove being larger than the annularly-shaped thermally insulating divider such that an inner surface and an outer surface of the annularly-shaped thermally insulating divider does not contact the base plate within the annular groove.

20. A system as recited in claim 17, wherein a shortest thermal conduction gap within each of the plurality of independently controllable gas volumes between the base plate and the support member is maintained within a range extending from about 0.001 inch to about 0.003 inch.

21. A system as recited in claim 16, wherein the computing platform is defined to monitor a temperature within one or more of the plurality of independently controllable gas volumes, the computing platform further defined to control the heat generation sources in response to the one or more monitored temperatures such that a prescribed radial temperature profile is maintained across the substrate to be supported by the electrostatic chuck.

* * * * *